United States Patent
Lindsey, Jr. et al.

(10) Patent No.: US 10,056,297 B1
(45) Date of Patent: Aug. 21, 2018

(54) MODIFIED PLASMA DICING PROCESS TO IMPROVE BACK METAL CLEAVING

(71) Applicants: Paul C. Lindsey, Jr., Lafayette, CA (US); Darrell W. Foote, Walnut Creek, CA (US)

(72) Inventors: Paul C. Lindsey, Jr., Lafayette, CA (US); Darrell W. Foote, Walnut Creek, CA (US)

(73) Assignee: Paul C. Lindsey, Jr., Lafayette, CA (US)

( * ) Notice: Subject to any disclaimer, the term of this patent is extended or adjusted under 35 U.S.C. 154(b) by 0 days.

(21) Appl. No.: 15/622,452

(22) Filed: Jun. 14, 2017

Related U.S. Application Data

(60) Provisional application No. 62/352,129, filed on Jun. 20, 2016.

(51) Int. Cl.
*H01L 21/00* (2006.01)
*H01L 23/34* (2006.01)
*H01L 21/78* (2006.01)
*H01L 23/544* (2006.01)
*H01L 21/321* (2006.01)
*H01L 21/683* (2006.01)
*H01L 21/3105* (2006.01)

(52) U.S. Cl.
CPC .......... *H01L 21/78* (2013.01); *H01L 21/3105* (2013.01); *H01L 21/321* (2013.01); *H01L 21/6835* (2013.01); *H01L 23/544* (2013.01); *H01L 2221/68327* (2013.01); *H01L 2223/5446* (2013.01)

(58) Field of Classification Search
CPC ........................................................ H01L 22/34
USPC .................. 257/723, 797; 438/68, 113, 458, 438/460–462
See application file for complete search history.

(56) References Cited

U.S. PATENT DOCUMENTS

| | | |
|---|---|---|
| 5,501,893 A | 3/1996 | Laermer et al. |
| 6,284,148 B1 | 9/2001 | Laermer et al. |
| 6,531,068 B2 | 3/2003 | Laermer et al. |
| 8,450,188 B1 | 5/2013 | Lindsey, Jr. |
| 8,664,089 B1 | 3/2014 | Burghout et al. |
| 8,906,745 B1 | 12/2014 | Lindsey, Jr. et al. |
| 9,136,173 B2 | 9/2015 | Grivna |
| 9,564,380 B2 * | 2/2017 | Suzumura ............... H01L 22/34 |

* cited by examiner

*Primary Examiner* — Calvin Lee
(74) *Attorney, Agent, or Firm* — Thomas R. Lampe

(57) ABSTRACT

A method for improving the cleaving of the back metal along the edges of the die of a semiconductor wafer mounted on a deformable plastic film including the step of depositing a layer of material on metal located on the wafer back side in etched streets.

9 Claims, 5 Drawing Sheets

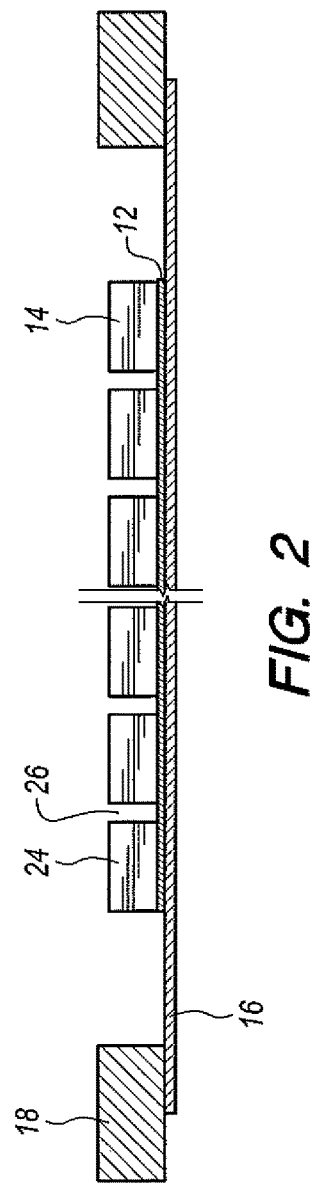
FIG. 2
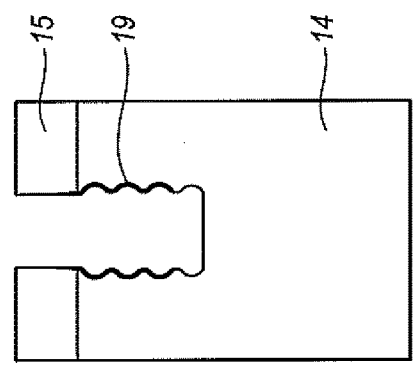
FIG. 3A
(PRIOR ART)
FIG. 3B
(PRIOR ART)

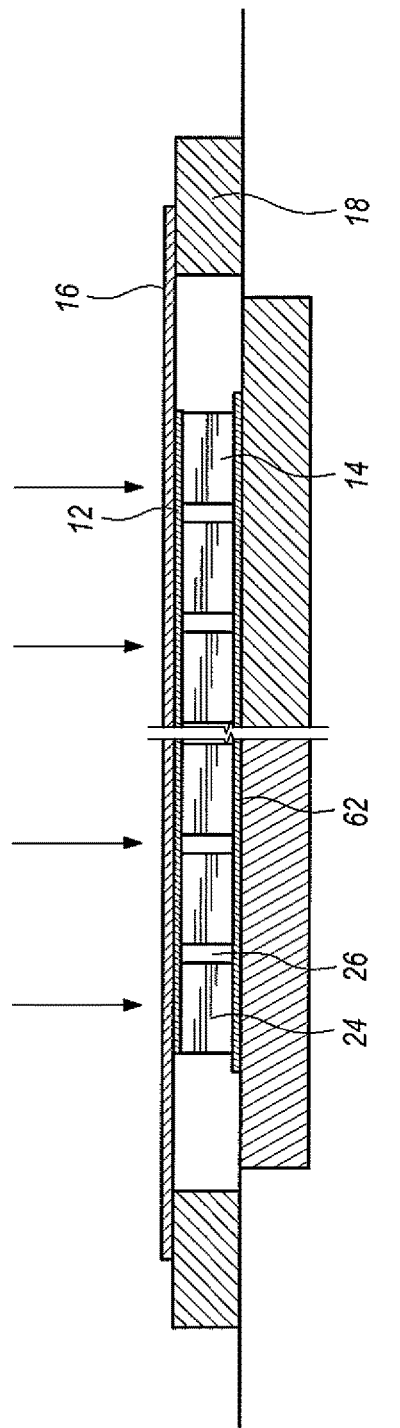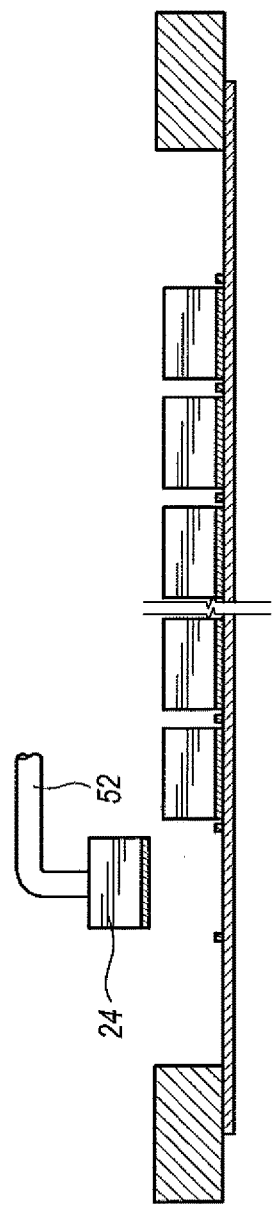

MODIFIED PLASMA DICING PROCESS TO IMPROVE BACK METAL CLEAVING

This application is based on and claims the benefit of U.S. Provisional Patent Application No. 62/352,129, filed Jun. 20, 2016.

TECHNICAL FIELD

The present invention relates to separation of semiconductor devices from a semiconductor wafer.

BACKGROUND OF THE INVENTION

In the past, numerous different methods have been used for singulating or dicing a semiconductor wafer, the process of dividing a semiconductor wafer into individual devices. The two most widely used methods at this time are sawing using a diamond saw blade and laser scribing using a focused laser beam to cut through the wafer. Neither method is ideal. Both result in a significant loss of material during the cutting process. As the size of semiconductor devices get smaller, the width of the line of lost material during the dicing process becomes comparable to the width of the device. If the width of the line of material lost during the dicing process could be made significantly smaller, many more devices could be made on each wafer, resulting in a large savings in the cost of fabricating the devices. In addition, both the sawing and laser scribing are processes that are done one line or a few lines at a time, resulting in a lengthy process time to complete the singulation of all devices on each semiconductor wafer.

Since the invention of plasma and reactive ion etching in the 1970s, many individuals have proposed using these processes for wafer singulation. These processes potentially could decrease the material loss during the dicing process by etching very narrow lines through the semiconductor wafer between the individual devices. In addition, since all of the lines on the semiconductor wafer are etched through at the same time, the length of the time required to complete the process can be significantly shorter than the other processes. In order for a plasma etching or a reactive ion etching process to be effective in wafer dicing, it would have to etch very deep, narrow trenches in the streets of the semiconductor wafer and it would have to etch at a very fast etch rate to be economically attractive. These two conditions have been achieved in the last several years by several companies, building on the work of Laermer, et al., (U.S. Pat. Nos. 5,501,893, 6,531,068 and 6,284,148). This method of using gas plasma to etch deep, narrow features is known as Deep Reactive Ion Etching (DRIB) or the Bosch process. The DRIB or Bosch process is used for high aspect ratio etching by alternating deposition and etching cycles. The deposition of a polymer layer protects the side walls from chemical etching during the subsequent etching cycle. Directional etching caused by ion bombardment removes the polymer layer at the bottom of the etched feature, so that the gas radials created by the plasma are able to etch the semiconductor substrate.

Semiconductor wafers usually have one or more metal layers applied to the back of the wafer during fabrication to provide ohmic contact and/or ease of die attach during packaging of the devices. These layers of metal are not readily etched using plasma etch processes. For the plasma dicing process to be economical, a cost effective method of removing the back metal that remains in the streets after the etch process is completed must be employed. Lindsey (U.S. Pat. No. 8,450,188) describes a method of removing the back metal layer by flipping the wafer over on another piece of adhesive plastic file, after the plasma etch has been completed and cutting the back metal. Burghout, et al., (U.S. Pat. No. 8,664,089) describes a method of cutting the back metal using a fluid ejected from a nozzle. Lindsey, et al., (U.S. Pat. No. 8,906,745) describes a method of separating the back metal in the streets by applying pressure using a fluid. Grivna (U.S. Pat. No. 9,136,173) describes a method of separating the back metal by applying a localized pressure using a stylus. The current invention teaches a method of modifying the plasma dicing process to improve the cleaving of the back metal along the edges of each die.

Disclosure of Invention

Other features, advantages and objects of the present invention will become apparent with reference to the following description and accompanying drawings.

BRIEF DESCRIPTION OF DRAWINGS

FIG. 2 is an enlarged, cross-sectional view taken along the line 2-2 of FIG. 1;

FIGS. 3A and 3B are two enlarged, cross-sectional views showing the process steps used in a DRIE or Bosch process;

FIG. 4 is an enlarged, cross-sectional view showing the etched wafer, inverted on a flat surface and the disposition of the back metal and plastic film during the application of pressure to the plastic film;

FIG. 5 is an enlarged, cross-sectional view showing a pick-and-place tool removing a singulated die from the plastic film;

MODE FOR CARRYING OUT THE INVENTION

Figure 1:
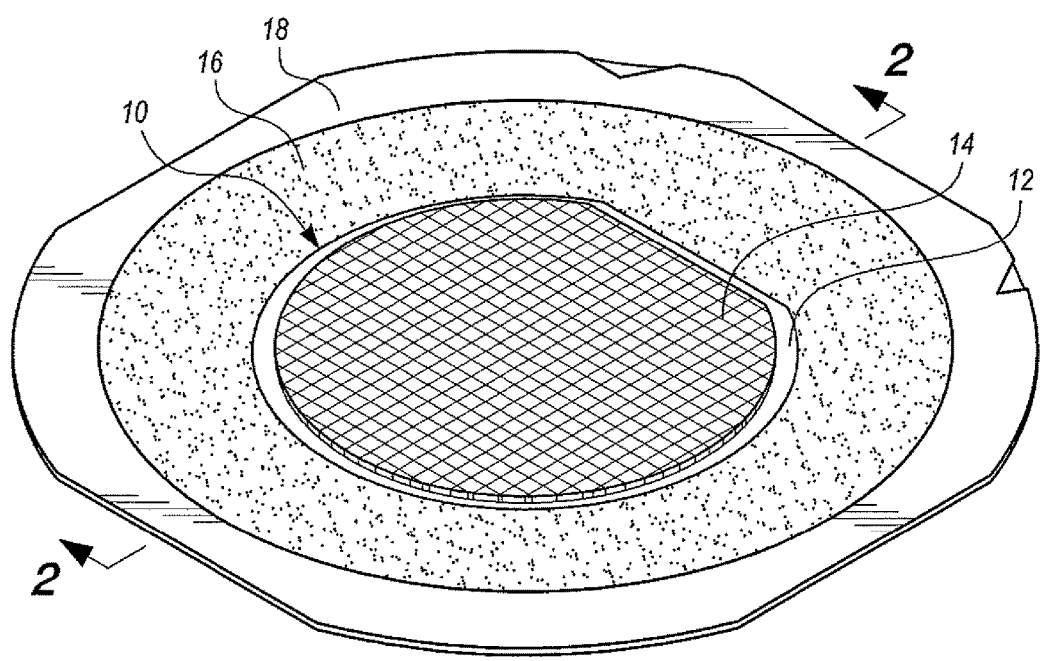
FIG. 1 is a top, perspective view illustrating a semiconductor wafer having a metal layer base adhesively secured to and supported by a plastic sheet surrounded by a frame and a semiconductor material layer which has been etched along the streets, the metal layer in the scribe streets not having been etched.

Referring now to the drawings, a semiconductor wafer 10 is illustrated, the wafer having a metal layer or base 12 and a semiconductor material layer 14. The semiconductor material layer 14 of the wafer shown in FIGS. 1 and 2 has been etched along streets to form individual semiconductor material dies but leaving the metal layer intact, even in the streets.

Any commercially available etching machine that is capable of carrying out a DRIE or Bosch process may be used. As shown in FIGS. 3A and 3B, a masking material 15 prevents etching from occurring in the active area of the semiconductor device 14. An etching process step removes material in the streets between the devices and is then followed by a deposition process step that deposits a polymer 19 as shown in FIG. 3A. In the next etching process step as shown in FIG. 3B the polymer is removed from the semiconductor substrate at the bottom of the etched line but remains on the sidewall of the opening. The alternating deposition and etching cycles create narrow, deep lines in the streets between the semiconductor devices. The etching process is continued in the normal fashion until the metal layer on the back side of the wafer is reached. The last process step in this sequence is an etch step to ensure that polymer does not remain at the bottom the street.

It is current practice to mount a semiconductor wafer to be diced or singulated on a plastic film that is stretched across a metal or plastic frame. The plastic film is usually coated with an adhesive layer.

In the arrangement illustrated, the metal layer 12 of the wafer 10 is adhesively attached to a plastic film 16 coated with an adhesive layer stretched on a frame 18. FIGS. 1 and 2 show the wafer 10, plastic film 16, and frame 18 removed from the etching machine after the above described etching of the semiconductor layer has been accomplished. If the etch process has been performed using a DRIB or Bosch Process, the excess protective polymer that remains on the sidewalls of the etched streets is removed using an appropriate process. The individual dies 24 are separated along intersecting streets 26 extending across the wafer.

In the next process step, as shown in FIG. 4, the wafer is positioned on a flat surface, such as a chuck. Pressure is applied to the plastic film. This pressure may be applied locally, or across the entire wafer using appropriate apparatuses. The pressure causes the plastic film to be pressed into the back of the etched streets. If the pressure is large enough, the resulting movement of the plastic film causes the metal in streets to break.

After the back metal process has been completed, the assembly of the wafer, plastic film, and frame are removed from the wafer chuck. It is current practice, after die singulation, to separate the die from each other by expanding the plastic film. In this case, both the individual die and the cleaved back metal in the streets are separated by the expansion of the plastic film. As shown in FIG. 5, the die 24 are then removed from the plastic film using the tool 52 in a standard pick-and-place system.

Figure 6:
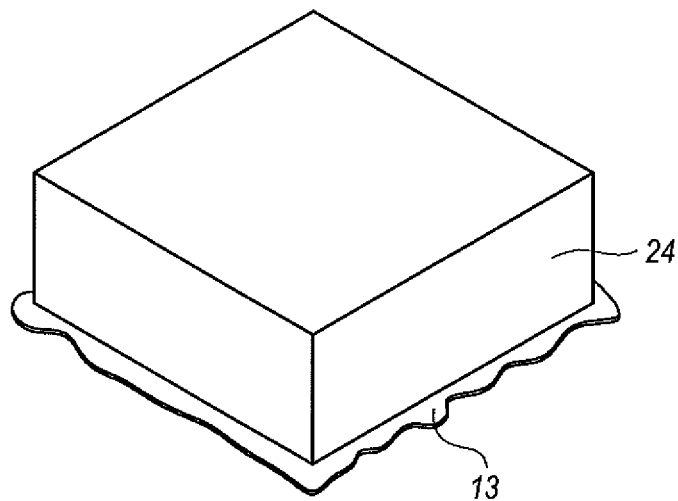
FIG. 6 is a perspective view showing back metal attached to the edges of the semiconductor die after a conventional back metal process after the die has been removed from the plastic film.

In the development of this back metal process, as shown in FIG. 4, the pressure that is applied to the plastic film 16 is gradually increased until the metal 12 in the streets is observed to break. However, under these conditions, there is frequently excess metal 13 left adhering to the edges of the die 24, as shown in FIG. 6.

Figure 7:
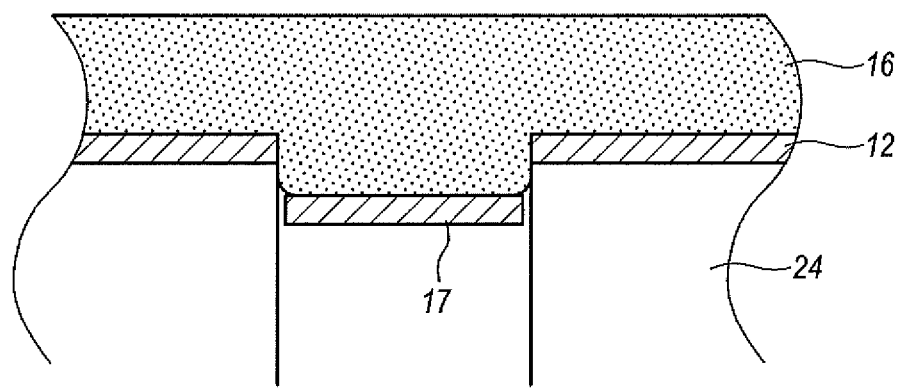
FIG. 7 is an enlarged, cross-sectional view showing the breaking of the back metal in the streets along the edges of the semiconductor die.
Figure 8:
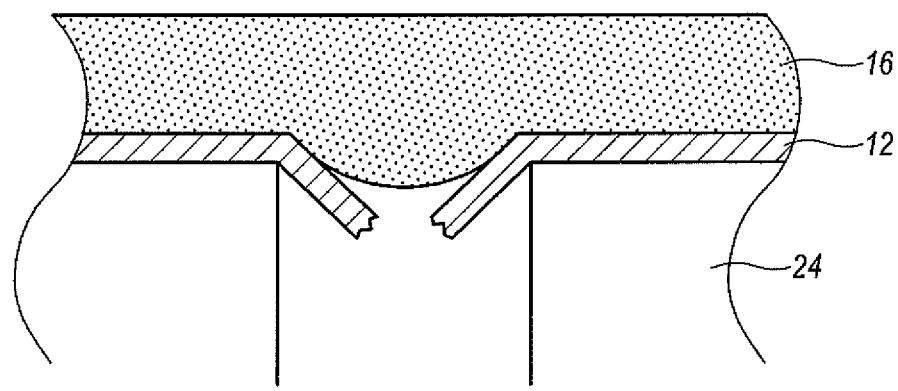
FIG. 8 is an enlarged, cross-sectional view showing the breaking of the back metal in the streets in irregular lines between the semiconductor die.

It has been found that in order to remove all of the back metal from the edges of the semiconductor die using a cleaving rather than a breaking process, there are two important conditions that must be satisfied. First, it is important that there be adequate adhesion between the plastic film and the back metal. Also, the strength of the metal length between the edges of the die must be great enough so that the metal breaks at the edges of the die rather than along some other line between the die. If these two conditions are met, when sufficient pressure is applied to the plastic film, the back metal will cleave along the edges of the die, as shown in FIG. 7, leaving the back metal in the streets 17 still adhering to the plastic film 12. However, as shown in FIG. 8, if the adhesion between the plastic film 16 and the back metal 12 is inadequate or if the strength of the metal film is inadequate, when sufficient pressure is applied to the plastic film to break the metal, the back metal breaks along random lines between the die 14, allowing the metal to become detached from the plastic film and continue to be connected to the edges of the die.

Figure 9:
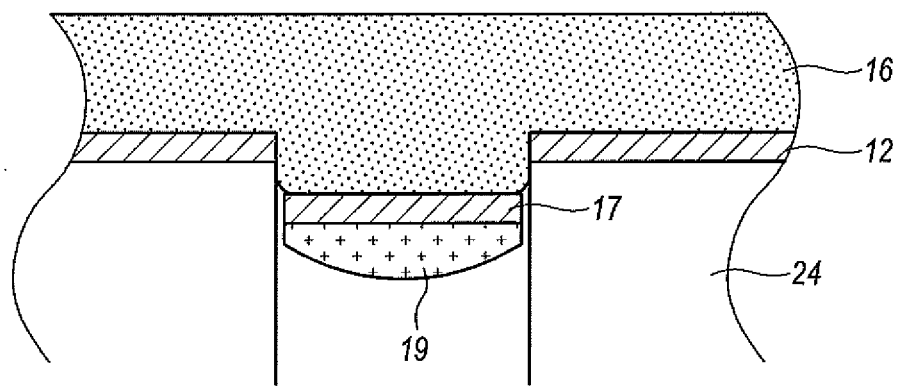
FIG. 9 is an enlarged, cross-sectional view showing the separation of the metal in the streets between the semiconductor die after completion of the back metal cleaving process enhanced by the addition of another deposited layer as the last step of the plasma dicing process as described in this invention.

It has been found that if the plasma dicing process is modified, the desired results can be achieved more easily in the back metal cleaving process. Instead of finishing the plasma dicing process with an etching step, in accordance with the teachings of the present invention an additional deposition step is added at the end of the process. As shown in FIG. 9, the additional deposited layer 19 is put on top of the back metal 17 in the streets. This layer may be made up of the polymer used for side wall protection earlier in the etch/deposition process or may be an entirely different material. This layer increases the strength of the metal film allowing the film to remain intact while cleaving along the edges of the die. It also improves the adhesion of the back metal to the plastic film on which the wafer is mounted.

The properties of the deposited layer may be easily changed by the composition of the gases used in the deposition, including the addition of other gases not used earlier in the deposition process step, the power and pressure used to generate the plasma to ionize and dissociate the gases, and the level of ion bombardment during the deposition of the layer. The properties of the layer can thus be chosen to achieve the desired results in the back metal cleaving process. The deposited layer as well as the polymer remaining on the sidewalls and bottom of the streets is removed after the back metal cleaving is completed.

The invention claimed is:

1. A method of improving cleaving of a back metal along the edges of die of a semiconductor wafer mounted on a deformable plastic film, the semi-conductor wafer having a wafer front side, a wafer back side, and scribe streets between said die and said back metal located at said wafer back side extending across said scribe streets, said method comprising the step of depositing a layer of material on said back metal in said scribe streets after the etching of said scribe streets is completed, said layer of material completely covering said back metal in said scribe streets and extending between the edges of the die at said scribe streets.

2. The method according to claim 1 including the step of changing the power and pressure used to generate plasma to ionize and dissociate the gases to improve the adhesion of the back metal layer to the plastic film on which the wafer is mounted.

3. The method according to claim 1 including the step of changing the level of ion bombardment during the deposition of the layer to improve the adhesion of the back metal layer to the plastic film on which the wafer is mounted.

4. The method according to claim 1 including the step of modifying the deposited layer by changing the composition of gases in generated plasma to improve the adhesion of the back metal to the plastic film on which the wafer is mounted.

5. The method according to claim 1 including the step of changing the power and pressure used to generate plasma to ionize and dissociate the gases to increase the strength of the back metal.

6. The method according to claim 1 including the step of changing the level of ion bombardment during the deposition of the layer to increase the strength of the back metal.

7. The method according to claim 1 including the step of modifying the deposited layer of material by changing the composition of gases in generated plasma to increase the strength of the back metal.

8. The method according to claim 7 including the step of using gases other than those used in earlier deposition steps to improve the adhesion of the back metal to the plastic film on which the wafer is mounted.

9. The method according to claim 7 including the step of using gases other than those used in earlier deposition steps to increase the strength of the back metal.

\* \* \* \* \*